(12) United States Patent
Zong et al.

(10) Patent No.: US 10,942,397 B2
(45) Date of Patent: Mar. 9, 2021

(54) SPATIAL PHASE MODULATOR AND METHOD FOR PRODUCING SPATIAL PHASE MODULATOR

(71) Applicants: Huawei Technologies Co., Ltd., Shenzhen (CN); Cambridge Enterprise Limited, Cambridgeshire (GB)

(72) Inventors: Liangjia Zong, Shenzhen (CN); Daping Chu, Cambridge (GB); Haining Yang, Cambridge (GB)

(73) Assignees: Huawei Technologies Co., Ltd., Shenzhen (CN); Cambridge Enterprise Limited, Cambridgeshire (GB)

( * ) Notice: Subject to any disclaimer, the term of this patent is extended or adjusted under 35 U.S.C. 154(b) by 106 days.

(21) Appl. No.: 15/797,795

(22) Filed: Oct. 30, 2017

(65) Prior Publication Data
US 2018/0046016 A1 Feb. 15, 2018

Related U.S. Application Data

(63) Continuation of application No. PCT/CN2015/077918, filed on Apr. 30, 2015.

(51) Int. Cl.
*G02F 1/1337* (2006.01)
*G02F 1/1362* (2006.01)
(Continued)

(52) U.S. Cl.
CPC ...... *G02F 1/133734* (2013.01); *G02F 1/1337* (2013.01); *G02F 1/133345* (2013.01);
(Continued)

(58) Field of Classification Search
CPC ......... G02F 1/133345; G02F 1/136277; G02F 1/136281; G02F 1/133553; G02F 2203/12; G02F 2203/50
See application file for complete search history.

(56) References Cited

U.S. PATENT DOCUMENTS

| | | |
|---|---|---|
| 3,853,386 A | 12/1974 | Ritter et al. |
| 4,012,119 A | 3/1977 | Adams et al. |
| 5,011,267 A | 4/1991 | Miller et al. |
| 5,808,717 A | 9/1998 | Van Aerle |
| 6,014,197 A | 1/2000 | Hikmet |

(Continued)

FOREIGN PATENT DOCUMENTS

| | | |
|---|---|---|
| CN | 1607447 A | 4/2005 |
| CN | 101470265 A | 7/2009 |

(Continued)

OTHER PUBLICATIONS

CN/201580079569.4, Office Action, dated Dec. 13, 2019.

*Primary Examiner* — Paisley L Wilson

(74) *Attorney, Agent, or Firm* — Leydig, Voit & Mayer, Ltd.

(57) ABSTRACT

A spatial phase modulator and a method for producing a spatial phase modulator are provided. The spatial phase modulator includes a first substrate and a second substrate that are meshed together, and a liquid crystal layer disposed between the two substrates, where a transparent electrode layer and a first alignment and guiding layer are disposed in a cascading manner on a side that is of the first substrate and that faces the liquid crystal layer; and an electrode layer and an insulation medium glass layer are disposed in a cascading manner on a side that is of the second substrate and that faces the liquid crystal layer, where the insulation medium glass layer has an inclined serration structure on a side facing the liquid crystal layer.

14 Claims, 5 Drawing Sheets

(51) Int. Cl.
*H01L 21/02* (2006.01)
*G02F 1/1333* (2006.01)
*G02F 1/1335* (2006.01)
*G02F 1/1343* (2006.01)

(52) U.S. Cl.
CPC .. *G02F 1/133553* (2013.01); *G02F 1/136277* (2013.01); *H01L 21/022* (2013.01); *H01L 21/02186* (2013.01); *H01L 21/02189* (2013.01); *G02F 1/13439* (2013.01); *G02F 1/133707* (2013.01); *G02F 2001/133773* (2013.01); *G02F 2001/133776* (2013.01); *G02F 2001/136281* (2013.01); *G02F 2203/12* (2013.01); *G02F 2203/50* (2013.01)

(56) References Cited

U.S. PATENT DOCUMENTS

| | | | |
|---|---|---|---|
| 6,362,863 | B1 | 3/2002 | Kataoka et al. |
| 7,283,191 | B2 * | 10/2007 | Tanaka .............. G02F 1/133734 349/123 |
| 7,995,165 | B2 * | 8/2011 | Huang .............. G02F 1/136209 349/113 |
| 2005/0052600 | A1 | 3/2005 | Hashimoto et al. |
| 2014/0063429 | A1 | 3/2014 | Huh et al. |

FOREIGN PATENT DOCUMENTS

| | | |
|---|---|---|
| CN | 101539694 A | 9/2009 |
| CN | 101661185 A | 3/2010 |
| CN | 103676348 A | 3/2014 |
| JP | H0194318 | 4/1989 |

\* cited by examiner

US 10,942,397 B2

SPATIAL PHASE MODULATOR AND METHOD FOR PRODUCING SPATIAL PHASE MODULATOR

CROSS-REFERENCE TO RELATED APPLICATIONS

This application is a continuation of International Application No. PCT/CN2015/077918, filed on Apr. 30, 2015, the disclosure of which is hereby incorporated by reference in its entirety.

TECHNICAL FIELD

Embodiments of the present invention relate to the communications field, and in particular, to a spatial phase modulator and a method for producing a spatial phase modulator.

BACKGROUND

Liquid Crystal on Silicon (LCoS), also referred to as a spatial phase modulator, is a reflection mode-based matrix liquid crystal apparatus of a quite small size. Generally, a single chip of spatial phase modulator includes millions of pixels, and each pixel is several or dozens of micrometers in size. Different functions of the spatial phase modulator are implemented by controlling voltage values on the pixels. Initially spatial phase modulators were mainly applied to the display field. A display device based on a spatial phase modulator can achieve high resolution and full color expression more easily than another liquid crystal display technology. As spatial phase modulators are further studied, the application scope of the spatial phase modulators is continuously expanded. Especially in recent years, as a new type of optical engines, spatial phase modulators are gradually applied to the optical communications field, including WSS, dispersion compensation, optical shaping, and the like.

Unlike application to the display field, application to the communications field is mainly based on a phase modulation effect of a spatial phase modulator. As a spatial phase modulator (SLM), the LCoS implements phase control on spatial light, thereby implementing a corresponding function of the spatial phase modulator. A conventional spatial phase modulator is shown in FIG. 1. A physical structure of the conventional spatial phase modulator includes a surface glass layer 1, a common ITO electrode layer 2, an upper alignment and guiding layer 3, a liquid crystal molecule layer 4, a lower alignment and guiding layer 5, an electrode layer 6, and a silicon-based backplane 7 from top to bottom. After a voltage is applied between the electrode layer 6 and the common ITO electrode layer 2, liquid crystal molecules deflect under an effect of an electric field. Different voltages cause different deflection angles. In addition, because of a birefringent effect of a liquid crystal molecule material, different deflection angles of the molecule material mean different birefringences and optical paths. Therefore, when incident light enters different locations of a liquid crystal layer, different optical phase delays are generated because loaded voltages are different, thereby implementing a spatial phase modulation effect of the incident light.

There is a layer of aluminized electrode in an active area of a spatial phase modulator. A size of the layer of aluminized electrode is corresponding to each pixel of the spatial phase modulator. Values of voltages applied to the pixels are different. Therefore, a gap area is required between neighboring pixels, to isolate interference from an electric field between two pixels. A material of the gap area is silicon, which basically does not reflect incident light. In this way, when light is incident to a backplane in the spatial phase modulator, most light incident to the aluminized electrode is reflected (generally >96%), and most light incident to the gap area is absorbed and lost. When a gap is narrowed, a reflectivity of a component can be increased. However, crosstalk between two neighboring pixels is increased due to an edge field effect, thereby affecting performance of the component. Therefore, when a spatial phase modulator component is designed, a loss and crosstalk need to be balanced, to ensure overall performance of the component. When a spatial phase modulator is applied to the optical communications field, an increase in a loss of the spatial phase modulator definitely causes an extra loss of a component, and a gain value of an optical amplifier needs to be increased. However, this results in greater amplifier noise, affecting system transmission performance. Therefore, when a spatial phase modulator is applied to the communications field, a component loss of the spatial phase modulator becomes especially important. A current commercial product is used as an example, a filling rate (which is defined as a proportion of an electrode area to an entire pixel area) of a product used in a communications band is 87%, and a reflectivity of a component is 60%. In this case, a loss caused by a reflectivity alone reaches 2.2 dB. Therefore, when a spatial phase modulator is used in an optical module (such as a WSS) as an optical switch engine, a loss caused by the spatial phase modulator reaches approximately 3 dB. However, a loss of a conventional MEMS optical engine is less than 1 dB. Therefore, performance of an optical component based on the spatial phase modulator is compromised in terms of a component loss.

As shown in FIG. 2, in the conventional art, an insulation medium glass layer 8 is added to a spatial phase modulator, so that a reflectivity of a component may be effectively increased. That is, a structure on a lower substrate in the spatial phase modulator includes a silicon-based backplane 7, an electrode layer 6 disposed on the silicon-based backplane, the insulation medium glass layer 8 disposed at the electrode layer 6, and a lower alignment and guiding layer 5 disposed at the insulation medium glass layer 8. However, introduction of the insulation medium glass layer 8 imposes specific difficulties on technological production for the following specific reason: A spatial phase modulator component has an alignment and guiding layer, made of a polymer material, between a liquid crystal molecule (LC) layer and a substrate. This layer is used for controlling a deflection direction and a deflection speed of LC molecules, to ensure stable operation of the spatial phase modulator component. For a conventional spatial phase modulator chip, an alignment and guiding layer is implemented on a silicon-based plate by means of mechanical friction. This has no impact on either overall performance of a spatial phase modulator or a subsequent technological process. However, for a chip structure of the spatial phase modulator to which the insulation medium glass layer 8 is added, because the alignment and guiding layer is located between the liquid crystal molecule layer and the insulation medium glass layer, the insulation medium glass layer is vulnerable to damages in a process of producing the alignment and guiding layer. Consequently, a yield and component performance are affected.

SUMMARY

The present invention provides a spatial phase modulator and a method for producing a spatial phase modulator, so as to increase a yield of spatial phase modulators and simplify a technology for producing a spatial phase modulator.

According to a first aspect, a spatial phase modulator is provided. The spatial phase modulator includes: a first substrate and a second substrate that are meshed together, and a liquid crystal layer disposed between the first substrate and the second substrate, where a transparent electrode layer and a first alignment and guiding layer are disposed, in a cascading manner in a direction in which the first substrate faces the second substrate, on a side that is of the first substrate and that faces the liquid crystal layer; and an electrode layer and an insulation medium glass layer are disposed, in a cascading manner in a direction in which the second substrate faces the first substrate, on a side that is of the second substrate and that faces the liquid crystal layer, where the insulation medium glass layer has an inclined serration structure on a side facing the liquid crystal layer, and when the transparent electrode layer and the electrode layer are charged to form an electric field, the inclined serration structure functions as a second alignment and guiding layer and coordinates with the first alignment and guiding layer to control a deflection direction of liquid crystal molecules at the liquid crystal layer.

With reference to the foregoing first aspect, in a first possible implementation, the insulation medium glass layer includes at least one pair of oxide layers with different reflectivities.

With reference to the first possible implementation of the foregoing first aspect, in a second possible implementation, oxide at the oxide layer is $ZrO_2$, $SiO_2$, or $TiO_2$.

With reference to the first possible implementation of the foregoing first aspect, in a third possible implementation, the inclined serration structure is disposed at an oxide layer adjacent to the liquid crystal layer.

With reference to the foregoing first aspect, in a fourth possible implementation, an inclined angle of each inclined serration is between 3° and 15°.

With reference to the foregoing first aspect, the first possible implementation of the first aspect, the second possible implementation of the first aspect, the third possible implementation of the first aspect, or the fourth possible implementation of the first aspect, in a fifth possible implementation, the first substrate is a glass substrate, and the second substrate is a silicon-based backplane.

With reference to the fifth possible implementation of the foregoing first aspect, in a sixth possible implementation, the electrode layer is an aluminized electrode layer.

According to a second aspect, a method for producing a spatial phase modulator is provided. The production method includes the following steps:

forming a transparent electrode layer and a first alignment and guiding layer on a first substrate;

forming an electrode layer and an insulation medium glass layer on a second substrate, and forming an inclined serration structure on a surface of the insulation medium glass layer, where the inclined serration structure functions as a second alignment and guiding layer and coordinates with the first alignment and guiding layer to control a deflection direction of liquid crystal molecules at the liquid crystal layer; and meshing the first substrate and the second substrate and filling the liquid crystal layer, where when the first substrate and the second substrate are meshed, the first alignment and guiding layer and the inclined serration structure are oppositely disposed.

With reference to the foregoing second aspect, in a first possible implementation, the forming an electrode layer and an insulation medium glass layer on a second substrate, and forming an inclined serration structure on a surface of the insulation medium glass layer is specifically:

forming the electrode layer on the first substrate; and forming at least one pair of oxide layers with different reflectivities at the formed electrode layer, where when the last oxide layer is being formed, the first substrate is rotated by a specified angle, to form the last oxide layer of the inclined serration structure, and an inclined direction of the inclined serration faces an alignment direction of the liquid crystal layer.

With reference to the first possible implementation of the foregoing second aspect, in a second possible implementation, when the last oxide layer of the inclined serration structure is formed, an inclined angle of the formed inclined serration is between 3° and 10°.

With reference to the second possible implementation of the foregoing second aspect, in a third possible implementation, the method further includes: before oxide layers with different reflectivities are alternately formed at the formed electrode layer, optimizing material, thickness, quantity of cycles, and inclined serration width of each oxide layer according to an operating wavelength and a characteristic requirement of a spatial phase modulator.

With reference to the second possible implementation of the foregoing second aspect, in a fourth possible implementation, when the at least one pair of oxide layers with different reflectivities are specifically disposed, a manner of $(0.5H\ 0.5L)^{[<]BEGINITALmn}$, $(0.5H\ L\ 0.5H)^{[<]BEGINITALmn}$, or $H\ (L\ H)^{[<]BEGINITALmn}$ may be used for production.

According to the spatial phase modulator provided in the first aspect and the method for producing a spatial phase modulator provided in the second aspect, in the spatial phase modulator, an inclined serration structure is formed at an insulation medium glass layer and functions as a second alignment and guiding layer. In this way, the second alignment and guiding layer can be produced when the insulation medium glass layer is produced. This simplifies steps for producing the spatial phase modulator. In addition, in comparison with the conventional art, in a process of producing the spatial phase modulator provided in the embodiments, the inclined serration structure is formed when the insulation medium glass layer is formed. This avoids prior-art damages to the insulation medium glass layer that are caused when an alignment and guiding layer is formed at the insulation medium glass layer by means of mechanical friction during production of a spatial phase modulator. Therefore, a yield of spatial phase modulators is increased, and in addition, a difficulty in producing a spatial phase modulator is reduced, and a production technology is simplified.

Figure 1:
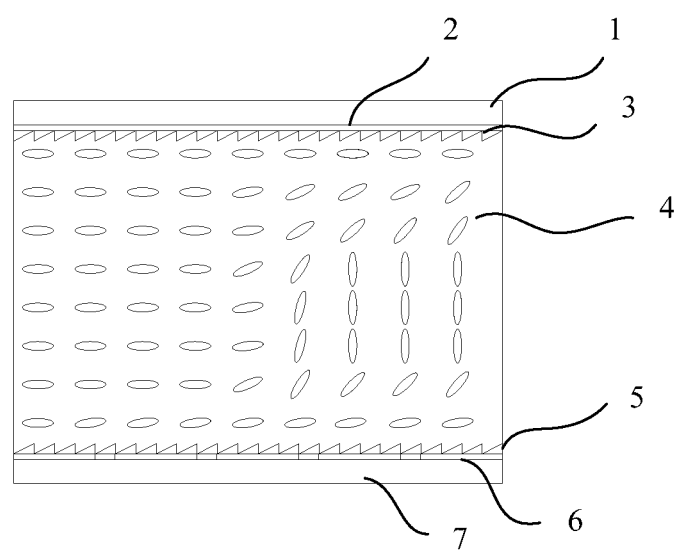
FIG. 1 is a schematic structural diagram of a spatial phase modulator in the conventional art.
Figure 2:
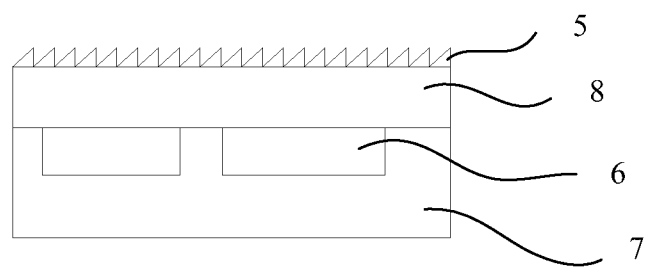
FIG. 2 is a schematic structural diagram of a silicon-based backplane of a spatial phase modulator in the conventional art.

| Reference numerals: | | |
|---|---|---|
| 1: Surface glass layer | 2: Common ITO electrode layer | 3: Upper alignment and guiding layer |
| 4: Liquid crystal molecule layer | 5: Lower alignment and guiding layer | 6: Electrode layer |
| 7: Silicon-based backplane | 8: Insulation glass layer | 10: Second substrate |
| 20: Electrode layer | 30: Insulation medium glass layer | 31: First oxide layer |
| 32: Second oxide layer | 321: Inclined serration structure | 40: Liquid crystal layer |
| 50: First alignment and guiding layer | 60: Transparent electrode layer | 70: First substrate |
| 80: Deposition source | | |

DESCRIPTION OF EMBODIMENTS

The following describes the specific embodiments of the present invention in detail with reference to accompanying drawings. It should be understood that the specific implementations described herein are merely used to explain the present invention but are not intended to limit the present invention.

Figure 3:
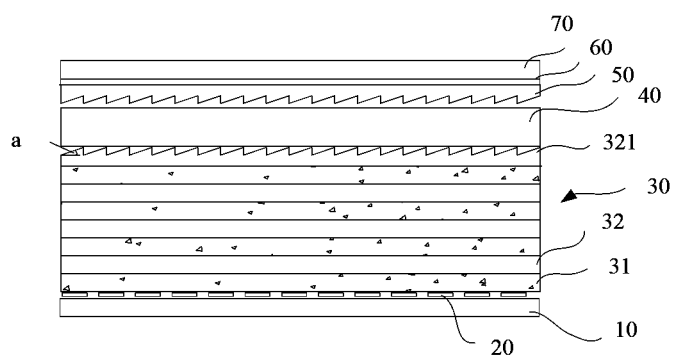
FIG. 3 is a schematic structural diagram of a spatial phase modulator according to an embodiment of the present invention.

As shown in FIG. 3, FIG. 3 is a schematic structural diagram of a spatial phase modulator according to an embodiment of the present invention.

This embodiment of the present invention provides the spatial phase modulator. The spatial phase modulator includes a first substrate 70 and a second substrate 10 that are meshed together, and a liquid crystal layer 40 disposed between the first substrate 70 and the second substrate 10, where a transparent electrode layer 60 and a first alignment and guiding layer 50 are disposed, in a cascading manner in a direction in which the first substrate 70 faces the second substrate 10, on a side that is of the first substrate 70 and that faces the liquid crystal layer 40; and an electrode layer 20 and an insulation medium glass layer 30 are disposed, in a cascading manner in a direction in which the second substrate 10 faces the first substrate 70, on a side that is of the second substrate 10 and that faces the liquid crystal layer 40, where the insulation medium glass layer 30 has an inclined serration structure 321 on a side facing the liquid crystal layer 40, and when the transparent electrode layer 60 and the electrode layer 20 are charged to form an electric field, the inclined serration structure 321 functions as a second alignment and guiding layer and coordinates with the first alignment and guiding layer 50 to control a deflection direction of liquid crystal molecules at the liquid crystal layer 40.

In the foregoing embodiment, an inclined serration structure 321 is formed at an insulation medium glass layer 30 and functions as a second alignment and guiding layer. In this way, the second alignment and guiding layer can be produced when the insulation medium glass layer 30 is produced. This simplifies steps for producing the spatial phase modulator. In addition, in comparison with the conventional art, in a process of producing the spatial phase modulator provided in this embodiment, the inclined serration structure 321 is formed when the insulation medium glass layer 30 is formed. This avoids prior-art damages to the insulation medium glass layer 30 that are caused when an alignment and guiding layer is formed at the insulation medium glass layer 30 by means of mechanical friction during production of a spatial phase modulator. Therefore, a yield of spatial phase modulators is increased, and in addition, a difficulty in producing a spatial phase modulator is reduced, and a production technology is simplified.

Figure 4A:
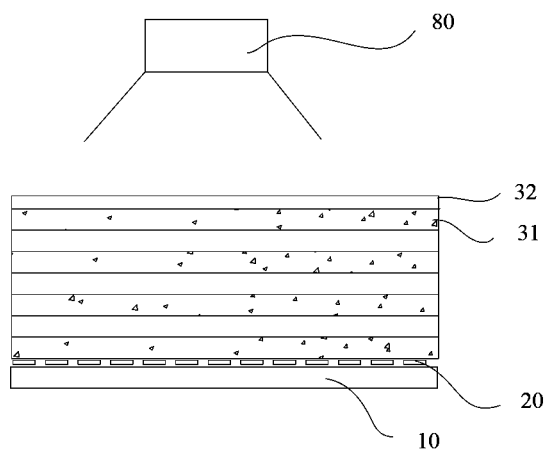
FIG. 4a and FIG. 4b are flowcharts of producing an insulation medium glass layer according to an embodiment of the present invention.
Figure 4B:
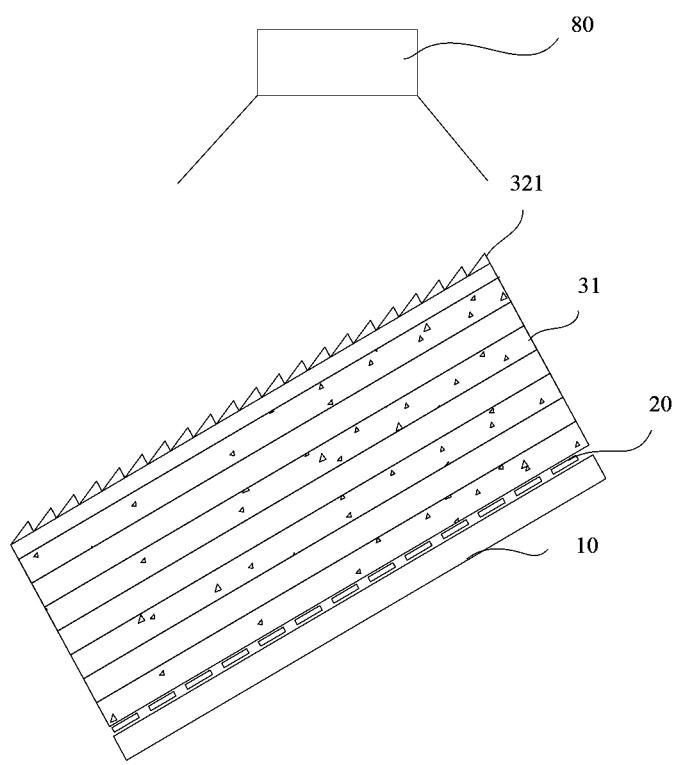

In addition, when the inclined serration structure 321 at the insulation medium glass layer 30 is specifically produced, an inclined angle of a serration may be flexibly changed without being affected by a device, thereby effectively increasing a switching speed of the spatial phase modulator. Specifically, as shown in FIG. 4a and FIG. 4b, FIG. 4a and FIG. 4b show technological steps for forming the insulation medium glass layer 30. The insulation medium glass layer 30 includes multiple oxide layers with different reflectivities. Specifically, the insulation medium glass layer 30 includes at least one pair of oxide layers with different reflectivities. For example, one pair of oxide layers with different reflectivities shown in FIG. 3 are respectively a first oxide layer 31 and a second oxide layer 32. When the insulation medium glass layer 30 is formed, first oxide layers 31 and second oxide layers 32 are alternately disposed. Oxide at the oxide layers is $ZrO_2$, $SiO_2$, $TiO_2$, or other oxide. During specific production, a proper oxide layer, thickness, quantity of cycles, and an inclined serration width x are first selected according to an operating wavelength and a characteristic (such as reflectivity) requirement of the spatial phase modulator, to first form the layers of oxide at the insulation medium glass layer 30. Then, the layers of oxide are deposited on a backplane in the spatial phase modulator by means of evaporation. The deposition manner may be a plasma method (plasma), a thermal evaporation method (thermal), an electron beam method (Electron), or the like. When the inclined serration structure 321 is formed, the inclined serration structure 321 is disposed at an oxide layer adjacent to the liquid crystal layer 40. Specifically, the second substrate 10 is rotated by an angle on a rotating platform (or a deposition source 80 is rotated by an angle relative to the second substrate 10), so that there is an included angle between the spatial phase modulator and the deposition source 80. The included angle is consistent with the inclined angle of the serration. The inclined angle is between 3° and 15°, for example, different inclined angles such as 3°, 5°, 7°, 10°, 12°, 14°, or 15°. An uppermost layer of material of the insulation medium glass layer 30 is deposited in an evaporation manner, such as a plasma, thermal, or electron source method, to form the inclined serration structure, as shown in FIG. 3. The inclined angle is an angle a, and the angle is between 3° and 10°, for example, different inclined angles such as 3°, 5°, 7°, or 10°. It can be learned from the foregoing descriptions that the inclined angle of the inclined serration structure 321 at the insulation medium glass layer 30 in the spatial phase modulator provided in this embodiment may be adjusted as required, without being affected by a structure of a device. This facilitates adjustment to the inclined angle of the inclined serration according to an actual case.

In a specific embodiment of the present invention, a glass substrate is used as the first substrate 70, and a silicon-based backplane is used as the second substrate 10. In addition, the electrode layer 20 in the spatial phase modulator is an aluminized electrode layer. The aluminized electrode layer and the transparent electrode layer 60 form an electric field, to provide electric field force to liquid crystal molecules for rotation.

Figure 5:
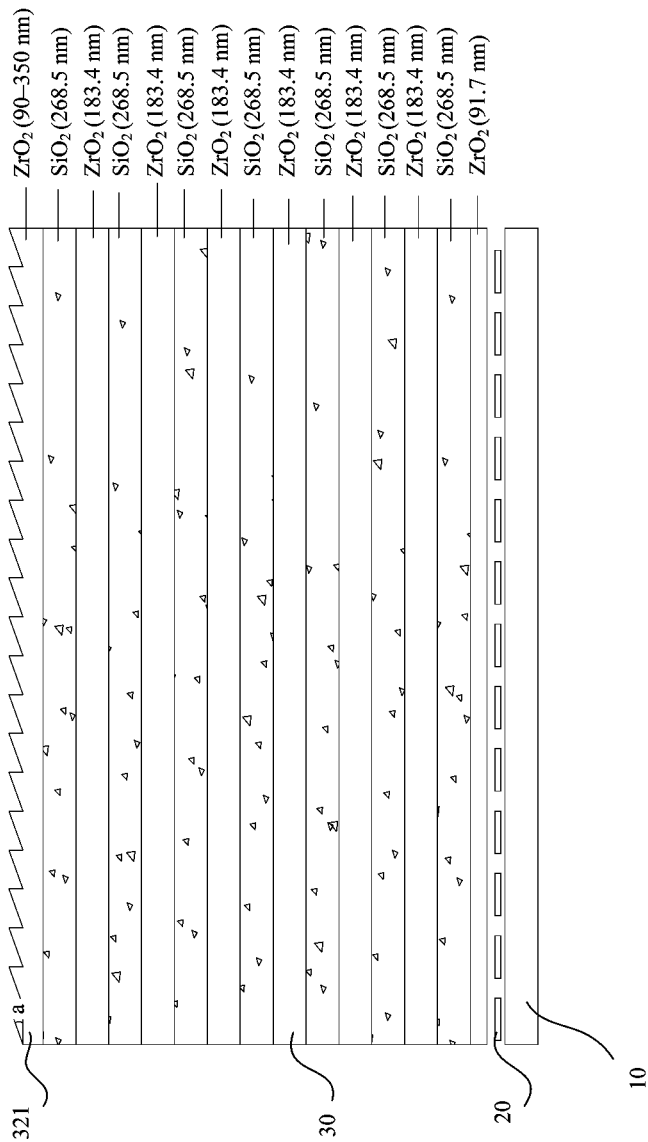
FIG. 5 is a schematic structural diagram of a spatial phase modulator according to an embodiment of the present invention.

For ease of understanding of the embodiments of the present invention, the following describes a specific embodiment of the present invention with reference to FIG. 5.

A first substrate 70, a transparent electrode layer 60, and a first alignment and guiding layer 50 in a spatial phase modulator provided in this embodiment are the same as those in the spatial phase modulator provided in the foregoing embodiment, and therefore, are not illustrated in FIG. 5. FIG. 5 shows only a specific structure of an insulation medium glass layer 30. $ZrO_2$ and $SiO_2$ are used as oxide at the insulation medium glass layer 30. A quantity of layers and thicknesses of the layers at the insulation medium glass layer 30 are shown in FIG. 5. The thicknesses are obtained by means of optimization according to an operating wavelength and a characteristic (such as reflectivity) requirement of the spatial phase modulator.

A band applied to the spatial phase modulator described in this embodiment is a 1550 nm band. First, it is assumed that an inclined angle of an inclined serration structure 321 is 5°, and that $ZrO_2$ and $SiO_2$ are selected as oxide materials of the insulation medium glass layer 30. The $ZrO_2$ is used as a high-reflectivity material, and the $SiO_2$ is used as a low-reflectivity material. The insulation medium glass layer 30 is designed in a $(0.5H\ L\ 0.5H)^{[<]BEGINITALmn}$ structure. Finally, an optimized structure of the insulation medium glass layer 30 is shown in FIG. 5. A serration width is 3 mm. Therefore, a thickness of an uppermost layer of $ZrO_2$ material varies between 90 nm and 350 nm. This layer is used as both an uppermost layer of the insulation medium glass layer 30 and a second alignment and guiding layer, and can implement deflecting and guiding of liquid crystal molecules.

Figure 6:
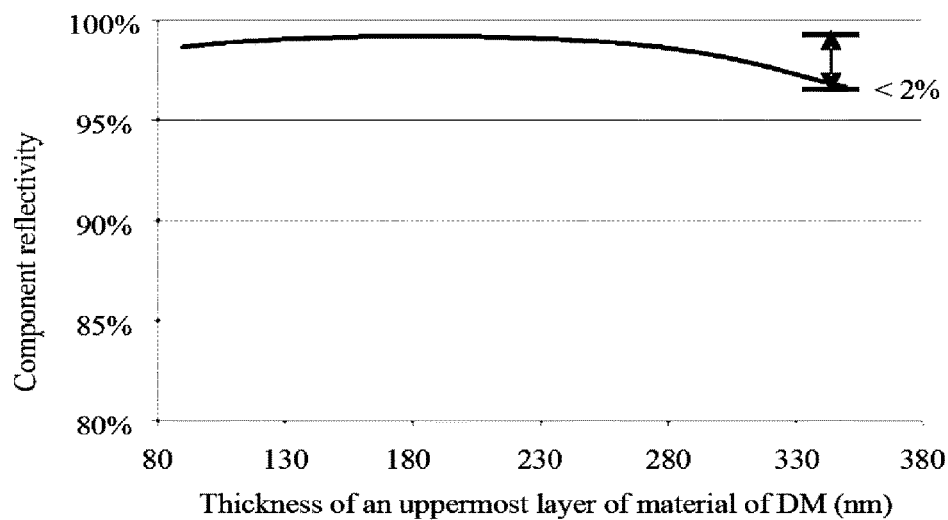
FIG. 6 is a reflectivity emulation diagram of the spatial phase modulator shown in FIG. 5.

The structure of the insulation medium glass layer 30 is emulated. It can be learned from the results (as shown in FIG. 6) that although the uppermost layer of the insulation medium glass layer 30 is a tilted layer, thicknesses, corresponding to different positions, of the structure of the insulation medium glass layer 30 are different. However, this has little impact on a reflectivity of a component. The reflectivity of the entire component is greater than 96%, and a reflectivity difference caused by different thicknesses is less than 2%.

Figure 7:
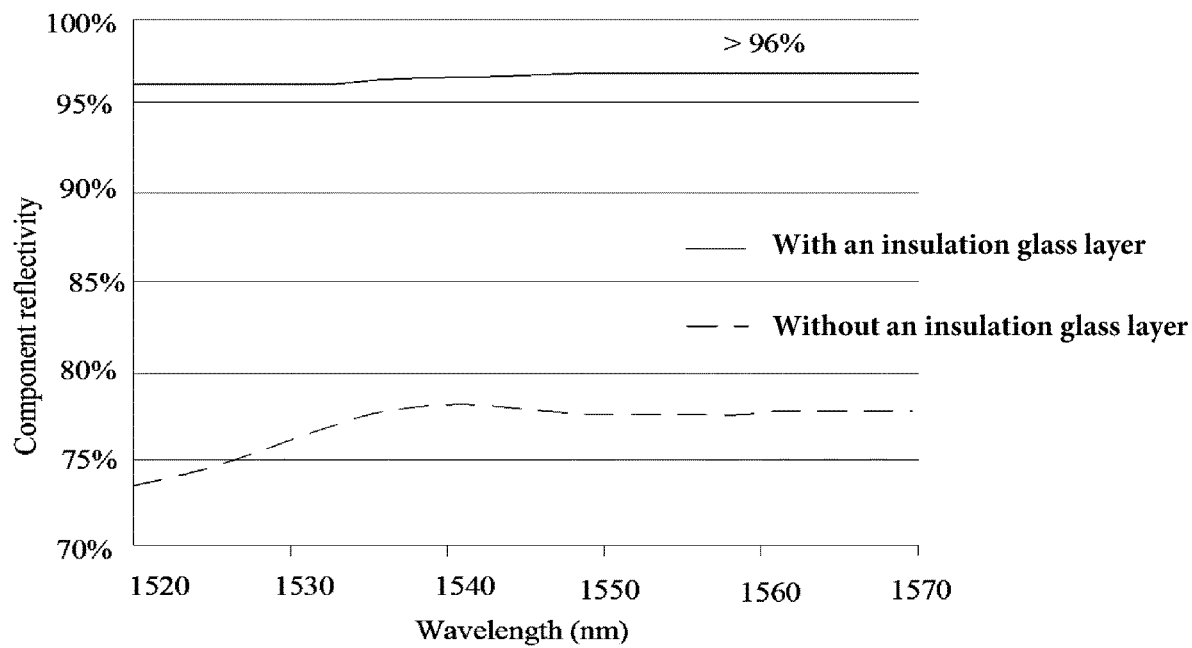
FIG. 7 is a response time experiment diagram of the spatial phase modulator shown in FIG. 5.

The entire component is packaged according to design of the insulation medium glass layer 30 and the aforementioned technological steps. FIG. 7 is experimental test results of reflectivities of the component. It can be learned from FIG. 7 that after the insulation medium glass layer 30 is added to the spatial phase modulator, a reflectivity of the component is increased from 75% to over 95%, and dependence on wavelengths, from 1520 nm to 1570 nm, is also reduced. After the insulation medium glass layer 30 is introduced, wavelength dependence is less than 1%.

Referring to FIG. 3, FIG. 4a, and FIG. 4b, an embodiment of the present invention further provides a method for producing a spatial phase modulator. The production method includes the following steps:

forming a transparent electrode layer 60 and a first alignment and guiding layer 50 on a first substrate 70;

forming an electrode layer 20 and an insulation medium glass layer 30 on a second substrate 10, and forming an inclined serration structure 321 on a surface of the insulation medium glass layer 30, where the inclined serration structure 321 functions as a second alignment and guiding layer and coordinates with the first alignment and guiding layer 50 to control a deflection direction of liquid crystal molecules at the liquid crystal layer 40; and meshing the first substrate 70 and the second substrate 10 and filling the liquid crystal layer 40, where when the first substrate 70 and the second substrate 10 are meshed, the first alignment and guiding layer 50 and the inclined serration structure 321 are oppositely disposed.

In the foregoing embodiment, an inclined serration structure 321 is formed when an insulation medium glass layer 30 is formed. This avoids prior-art damages to the insulation medium glass layer 30 that are caused when an alignment and guiding layer is formed at the insulation medium glass layer 30 by means of mechanical friction during production of a spatial phase modulator. Therefore, a yield of spatial phase modulators is increased, and in addition, a difficulty in producing a spatial phase modulator is reduced, and a production technology is simplified. In addition, an inclined angle of the inclined serration structure 321 may be flexibly changed. That is, the inclined angle of the inclined serration structure 321 may be determined according to a degree of inclination after the insulation medium glass layer is adjusted, without being affected by a device, thereby effectively increasing a switching speed of the spatial phase modulator.

For ease of understanding of the production method provided in this embodiment, the following provides descriptions with reference to detailed production steps.

Step 1: Form a transparent electrode layer 60 and a first alignment and guiding layer 50 on a first substrate 70.

Specifically, a glass substrate is used as the first substrate 70. The transparent electrode layer 60 is formed on the glass substrate by means of etching and exposure or the like. A layer of oxide is deposited on the formed transparent electrode layer 60, and the first alignment and guiding layer 50 is formed by means of mechanical friction.

Step 2: Form an electrode layer 20 and an insulation medium glass layer 30 on a second substrate 10, and form an inclined serration structure 321 on a surface of the insulation medium glass layer 30, where the inclined serration structure 321 functions as a second alignment and guiding layer and coordinates with the first alignment and guiding layer 50 to control a deflection direction of liquid crystal molecules at the liquid crystal layer 40.

Specifically, the electrode layer 20 is first formed on the first substrate 70. Then, at least one pair of oxide layers with different reflectivities are formed at the formed electrode layer 20. When the last oxide layer is being formed, the first substrate 70 is rotated by a specified angle, to form the last oxide layer of the inclined serration structure 321. An inclined direction of the inclined serration faces an alignment direction of the liquid crystal layer 40.

Before oxide layers with different reflectivities are alternately formed at the formed electrode layer 20, material, thickness, quantity of cycles, and inclined serration width of each oxide layer are optimized according to an operating wavelength and a characteristic requirement of a spatial phase modulator. When the at least one pair of oxide layers with different reflectivities are specifically disposed, a manner of $(0.5H\ 0.5L)^{[<]BEGINITALmn}$, $(0.5H\ L\ 0.5H)^{[<]BEGINITALmn}$, or $H\ (L\ H)^{[<]BEGINITALmn}$ may be used for production. In this embodiment, a band C (1530-1570 nm) is used as an example. H represents an optical thickness that is one-fourth of a wavelength in the band C (where the wavelength is generally a center wavelength 1550 nm) (high-reflectivity material); L represents an optical thickness that is one-fourth of 1550 nm (low-reflectivity material); and n represents a quantity of repetition times. For example, if a high-reflectivity material is A, a reflectivity of the material A is r1, a low-reflectivity material is B, a reflectivity of the material B is r2, and a value of n is 3, materials of (0.5H 0.5L)$^n$ are sequentially ABABAB, a thickness of the material A is (0.5×1550 nm)/(4×r1), and a thickness of B is (0.5×1550 nm)/(4×r2); materials of (0.5H L 0.5H)$^n$ are sequentially ABA ABA ABA, a thickness of the material A is (0.5×1550 nm)/(4×r1), and a thickness of B is (1×1550 nm)/(4×r2); and materials of H (L H)$^n$ are sequentially A BA BA BA, a thickness of the material A is (1×1550 nm)/(4×r1), and a thickness of B is (1×1550 nm)/(4×r2).

As shown in FIG. 4a, the oxide layers are deposited on a backplane in the spatial phase modulator by means of evaporation. The deposition manner may be a plasma method (plasma), a thermal evaporation method (thermal), an electron beam method (Electron), or the like. A thickness of each layer is implemented, according to an optimized value determined when the insulation medium glass layer 30 is designed, by controlling parameters such as a deposition temperature and time. The process is repeated multiple times to implement deposition of layers (excluding an uppermost oxide layer, with an inclined angle, at the insulation medium glass layer 30) at the insulation medium glass layer 30. After the oxide layer is completed, as shown in FIG. 4b, a silicon-based backplane is rotated by an angle on a rotating platform (or a deposition source 80 is rotated by an angle relative to the silicon-based backplane), so that there is an included angle between the spatial phase modulator and the deposition source 80. The included angle is consistent with an inclined angle of a serration. The inclined angle is between 3° and 10°, for example, different inclined angles such as 3°, 5°, 7°, or 10°. An uppermost layer of material of the insulation medium glass layer 30 is deposited in an evaporation manner, such as a plasma, thermal, or electron source method.

Step 3: Mesh the first substrate 70 and the second substrate 10 and fill the liquid crystal layer 40, where when the first substrate 70 and the second substrate 10 are meshed, the first alignment and guiding layer 50 and the inclined serration structure 321 are oppositely disposed.

Specifically, the first substrate 70 and the second substrate 10 are meshed, and the first alignment and guiding layer 50 and the inclined serration structure 321 are oppositely disposed. Liquid crystal is filled between the first substrate 70 and the second substrate 10, to complete production of the entire spatial phase modulator.

It can be learned from descriptions in the foregoing specific embodiments, in this embodiment, during production of a spatial phase modulator, when an oxide layer is formed, an inclined serration structure 321 that coordinates with a first alignment and guiding layer 50 is formed using a same technology, thereby facilitating production of the spatial phase modulator. In addition, this avoids damages to oxide that are caused when a second alignment and guiding layer is formed at the oxide layer by using a friction technology. Therefore, a yield of spatial phase modulators is increased.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. A spatial phase modulator, comprising:
a first substrate and an opposing second substrate, and a liquid crystal layer disposed between the first substrate and the second substrate,
wherein a transparent electrode layer and a first alignment and guiding layer are disposed in a cascading manner, in a direction in which the first substrate faces the second substrate, on a side that is of the first substrate and that faces the liquid crystal layer;
wherein an aluminized electrode layer and an insulation medium glass layer are disposed in a cascading manner, in a direction in which the second substrate faces the first substrate, on a side that is of the second substrate and that faces the liquid crystal layer, wherein the insulation medium glass layer has an inclined serration structure on a side facing the liquid crystal layer, and when the transparent electrode layer and the aluminized electrode layer are charged to form an electric field, the inclined serration structure functions as a second alignment and guiding layer and coordinates with the first alignment and guiding layer to control a deflection direction of liquid crystal molecules at the liquid crystal layer and the electric field also provides an electric field force to the liquid crystal molecules for rotation;
wherein the insulation medium glass layer comprises pairs of oxide layers with different reflectivities and the pairs of oxide layers with different reflectivities are formed by sequential deposition of individual layers in a stacked manner over the electrode layer;
wherein the pairs of oxide layers with different reflectivities comprise: a first oxide layer formed of a first oxide, and a second oxide layer formed of a second oxide that is different from the first oxide, the first oxide layer having a greater reflectivity as compared to a reflectivity of the second oxide layer,
wherein a first pair of oxide layers of the pairs of oxide layers of the insulation medium glass layer is adjacent to the liquid crystal layer, and the inclined serration structure of the insulation medium glass layer is formed by the first oxide layer of the first pair of oxide layers,
wherein the first oxide of the first oxide layer of the first pair of oxide layers is one of: $ZrO_2$, and $TiO_2$, and wherein the second oxide of the second oxide layer of the first pair of oxide layers is $SiO_2$, and
wherein the pairs of oxide layers with different reflectivities are specifically disposed in a manner of (0.5H 0.5L)*n, (0.5H L 0.5L)*n, or H (L H)*n, where H represents an optical thickness of a high-reflectivity material that is one-fourth of an operating wavelength, L represents an optical thickness of a low-reflectivity material that is one-fourth of the operating wavelength, and n represents a quantity of repetition times.

2. The spatial phase modulator according to claim 1, wherein an inclined angle of each inclined serration is between 3° and 15°.

3. The spatial phase modulator according to claim 2, wherein the inclined angle of each inclined serration is between 3° and 10°.

4. The spatial phase modulator according to claim 3, wherein the inclined angle of each inclined serration is one of: 3°, 5°, 7°, and 10°.

5. The spatial phase modulator according to claim 2, wherein the inclined angle of each inclined serration is one of: 12°, 14°, and 15°.

6. The spatial phase modulator according to claim 1, wherein the first substrate is a glass substrate, and the second substrate is a silicon-based backplane.

7. The spatial phase modulator according to claim 1, wherein the second alignment and guiding layer is produced when an insulation medium glass layer is produced.

8. The spatial phase modulator according to claim 1, wherein the pairs of oxide layers are deposited by using one of a plasma method, a thermal evaporation method, or an electron beam method.

9. A method for producing a spatial phase modulator, the method comprising:
   forming a transparent electrode layer and a first alignment and guiding layer on a first substrate;
   forming an aluminized electrode layer and an insulation medium glass layer on a second substrate, and forming an inclined serration structure on a surface of the insulation medium glass layer, wherein the inclined serration structure functions as a second alignment and guiding layer and coordinates with the first alignment and guiding layer to control a deflection direction of liquid crystal molecules at a liquid crystal layer, wherein the aluminized electrode layer and the insulation medium glass layer are disposed in a cascading manner, in a direction in which the second substrate faces the first substrate, on a side that is of the second substrate and that faces the liquid crystal layer, wherein the insulation medium glass layer has an inclined serration structure on a side facing the liquid crystal layer, and when the transparent electrode layer and the aluminized electrode layer are charged to form an electric field, the inclined serration structure functions as a second alignment and guiding layer and coordinates with the first alignment and guiding layer to control a deflection direction of liquid crystal molecules at the liquid crystal layer and the electric field also provides an electric field force to the liquid crystal molecules for rotation; and
   meshing the first substrate and the second substrate and filling the liquid crystal layer between the first substrate and the second substrate, wherein when the first substrate and the second substrate are meshed, the first alignment and guiding layer and the inclined serration structure are oppositely disposed, wherein: the forming the aluminized electrode layer and the insulation medium glass layer on the second substrate, and forming the inclined serration structure on the surface of the insulation medium glass layer, comprise:
   forming the aluminized electrode layer on the second substrate; and
   forming pairs of oxide layers with different reflectivities at the formed aluminized electrode layer, wherein the pairs of oxide layers with different reflectivities are formed by sequential deposition of individual layers in a stacked manner over the aluminized electrode layer, wherein the pairs of oxide layers with different reflectivities comprise: a first oxide layer formed of a first oxide, and a second oxide layer formed of a second oxide that is different from the first oxide, the first oxide layer having a greater reflectivity as compared to a reflectivity of the second oxide layer, wherein when a last oxide layer is being formed, the second substrate is rotated by a specified angle, to form the last oxide layer of the inclined serration structure, and an inclined direction of each inclined serration faces an alignment direction of the liquid crystal layer, wherein a first pair of oxide layers of the pairs of oxide layers of the insulation medium glass layer is adjacent to the liquid crystal layer, and the inclined serration structure of the insulation medium glass layer is formed by the first oxide layer of the first pair of oxide layers, and wherein the first oxide of the first oxide layer of the first pair of oxide layers is one of: $ZrO_2$, and $TiO_2$, and wherein the second oxide of the second oxide layer of the first pair of oxide layers is $SiO_2$, and
   wherein the pairs of oxide layers with different reflectivities are specifically disposed in a manner of (0.5H 0.5L)*n, (0.5H L 0.5L)*n, or H (L H)*n, where H represents an optical thickness of a high-reflectivity material that is one-fourth of an operating wavelength, L represents an optical thickness of a low-reflectivity material that is one-fourth of the operating wavelength, and n represents a quantity of repetition times.

10. The method according to claim 9, wherein when the last oxide layer of the inclined serration structure is formed, an inclined angle of each formed inclined serration is between 3° and 15°.

11. The method according to claim 10, further comprising: before oxide layers with different reflectivities are alternately formed at the formed electrode layer, determining: a material, a thickness of the material, and the inclined serration width, of each oxide layer according to an operating wavelength of the spatial phase modulator.

12. The method according to claim 9, wherein the last oxide layer is formed at a thickness of between 90 nm and 350 nm.

13. The method according to claim 9, wherein the second alignment and guiding layer is produced when the insulation medium glass layer is produced.

14. The method according to claim 9, wherein the pairs of oxide layers are deposited by using one of a plasma method, a thermal evaporation method, or an electron beam method.

* * * * *